United States Patent
Egbe et al.

(10) Patent No.: US 6,943,142 B2
(45) Date of Patent: Sep. 13, 2005

(54) AQUEOUS STRIPPING AND CLEANING COMPOSITION

(75) Inventors: Matthew I. Egbe, West Norriton, PA (US); Darryl W. Peters, Stewartsville, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 5 days.

(21) Appl. No.: 10/042,612

(22) Filed: Jan. 9, 2002

(65) Prior Publication Data

US 2003/0130146 A1 Jul. 10, 2003

(51) Int. Cl.⁷ ............................ C11D 7/50; C11D 7/34
(52) U.S. Cl. ..................... 510/495; 510/175; 510/176; 510/461; 510/492; 510/493
(58) Field of Search ................. 510/175, 176, 510/461, 492, 493, 495, 489, 499, 692, 108, 109; 134/2, 3, 36, 41, 902; 252/175, 186.1

(56) References Cited

U.S. PATENT DOCUMENTS

| | | | | |
|---|---|---|---|---|
| 3,653,931 A | * | 4/1972 | Borchert et al. ............... 106/3 |
| 3,887,497 A | * | 6/1975 | Ulvild ......................... 510/420 |
| 3,915,902 A | * | 10/1975 | Ancel et al. ................. 510/428 |
| 4,165,295 A | * | 8/1979 | Vander Mey ............... 510/176 |
| 4,199,483 A | * | 4/1980 | Jones ......................... 510/335 |
| 4,215,005 A | * | 7/1980 | Vander Mey ............... 510/176 |
| 4,221,674 A | * | 9/1980 | Vander Mey ............... 510/176 |
| 4,242,218 A | * | 12/1980 | Vander Mey ............... 510/176 |
| 4,321,166 A | * | 3/1982 | McGrady .................... 510/335 |
| 4,617,251 A | * | 10/1986 | Sizensky .................... 430/256 |
| 5,308,745 A | * | 5/1994 | Schwartzkopf ............. 430/329 |
| 5,512,201 A | * | 4/1996 | Singh et al. ................ 252/79.4 |
| 5,534,177 A | * | 7/1996 | Mayhan ..................... 510/245 |
| 5,888,308 A | * | 3/1999 | Sachdev et al. ............ 134/1 |
| 5,972,862 A | * | 10/1999 | Torii et al. ................. 510/175 |
| 6,152,969 A | * | 11/2000 | Matsumoto et al. ........... 8/658 |
| 6,231,677 B1 | * | 5/2001 | Ishikawa et al. ............... 134/3 |
| 6,232,283 B1 | * | 5/2001 | Inoue et al. ................ 510/405 |
| 6,417,112 B1 | | 7/2002 | Peyne et al. ................ 438/754 |
| 6,486,115 B1 | * | 11/2002 | Weaver et al. ............. 510/417 |
| 6,498,131 B1 | * | 12/2002 | Small et al. ................ 510/175 |

* cited by examiner

*Primary Examiner*—M. Kornakov
(74) *Attorney, Agent, or Firm*—Rosaleen P. Morris-Oskanian

(57) ABSTRACT

The present invention relates to aqueous compositions used to remove post etch organic and inorganic residue as well polymeric residues and contaminants from semiconductor substrates. The compositions are comprised of a water soluble organic solvent, a sulfonic acid and water.

13 Claims, No Drawings

AQUEOUS STRIPPING AND CLEANING COMPOSITION

CROSS-REFERENCE TO RELATED APPLICATIONS

Not applicable

STATEMENT REGARDING FEDERALLY FUNDED SPONSORED RESEARCH OR DEVELOPMENT

Not applicable

BACKGROUND OF THE INVENTION

In the manufacture of semiconductors or semiconductor microcircuits it is necessary to remove materials from the surface of the substrate of the semiconductor device. In some instances the materials to be removed are polymeric compositions referred to as photoresists. In other instances the materials to be removed are residues of etching or ashing processes or simply contaminants. The purpose of stripping and/or cleaning compositions is to remove unwanted materials from a semiconductor substrate without corroding, dissolving or dulling the exposed surface of the substrate.

The art contains numerous references to compositions of different types for use in stripping photoresist and/or cleaning etch residue, ash or other contaminants from semiconductor substrates. For example a series of patents issued to Allied Signal disclose nonaqueous organic stripping compositions comprising one or more organic sulfonic acids in conjunction with organic solvents and various improvements. The first patent in the series U.S. Pat. No. 4,165,295 discloses a composition for removing polymeric organic substances such as photoresist comprising one or more organic, sulfonic acids one or more organic solvents, optionally a phenol and from about 5 to 250 ppm of a fluoride ion. The second patent U.S. Pat. No. 4,215,005 provides an improvement in the composition where in the fluoride is present in conjunction with a complexing agent having a nitrogen with an available unshared electron pair. The third patent in the series U.S. Pat. No. 4,221,674 provides another improvement in the composition where between 0.01 to 5 weight % of a nitrile compound is added to the composition. The fourth patent in the series U.S. Pat. No. 4,242,218 comprises a phenol free stripping composition comprising a sulfonic acid in admixture with chlorinated aryl compounds, alkylaryl compounds having 1–14 alkyl carbon atoms an isoparaffinic hydrocarbon or mixtures thereof.

U.S. Pat. No. 5,308,745 discloses alkaline containing photoresist stripping compositions having reduced metal corrosion containing non-nitrogen containing weak acids having a pK in an aqueous solution of 2.0 or higher and an equivalent weight of less than about 140. The weak acids are employed in an amount that will neutralize from 19% to 75% of the amine present in the composition. U.S. Pat. No. 5,972,862 discloses a cleaning liquid for semiconductor devices comprising a fluoride containing compound, a water soluble organic solvent, inorganic or organic acids and optionally a quaternary ammonium salt or carboxylic acid ammonium salt and/or organic carboxylic acid amine salt. U.S. Pat. No. 6,231,677 discloses the use of one or more carboxylic acids in stripping compositions. WO 00/02238 discloses a cleaning chemistry based on a choline compound such as choline hydroxide. The compositions are comprised of a choline compound, water and an organic solvent. The compositions may in addition contain hydroxyl amine and a corrosion inhibitor.

BRIEF SUMMARY OF THE INVENTION

The invention relates to aqueous compositions used to remove photoresist, etch and ash residue and contaminants from semiconductor substrates. The aqueous compositions have a low surface tension, low viscosity and are compatible with various substrates including Al/Cu, Cu, Ti, W, Ta, TiN, W, TaN, low-k materials such as methylsilsesquioxane (MSQ), black diamond, SiLK and high-k materials such as Pt/BST/oxide. BST is barium-strontium-tantanate. The compositions contain a water soluble organic solvent, a sulfonic acid, water and optionally corrosion inhibitors. The compositions of the invention are free of fluoride containing compounds and inorganic amines.

BRIEF DESCRIPTION OF THE SEVERAL VIEWS OF THE DRAWINGS

Not applicable

DETAILED DESCRIPTION OF THE INVENTION

The invention relates to aqueous compositions used to remove photoresist, etch and ash residue and contaminants from semiconductor substrates. The compositions are comprised of a water soluble organic solvent that is soluble in water, a sulfonic acid or its corresponding salt, water and optionally a corrosion inhibitor.

The water soluble organic solvent includes organic amines, amides, sulfoxides, sulfones, lactams, imidazolidinones, lactones, polyhydric alcohols and the like. Examples of organic amines include monoethanolamine, N-methylethanolamine, ethylenediamine, 2-(2-aminoetylamino)ethanol, diethanolamine, dipropylamine, 2-ethylaminoethanol, dimethylaminoethanol, cyclohexylamine, benzylamine, pyrrole, pyrrolidine, pyridine, morpholine, piperidine, oxazole and the like. Examples of amides includes N,N-dimethylformamide, dimethylacetamide, diethylacetamide and the like. Examples of sulfoxides include dimethyl sulfoxide. Examples of sulfones include dimethyl sulfone and diethyl sulfone. Examples of lactams includes N-methyl-2-pyrrolidone and imidazolidinone. Examples of lactones includes butyrolactone and valerolactone. Examples of polyhydric alcohols includes ethylene glycol, propylene glycol, ethylene glycol monomethyl ether acetate, etc. Examples of preferred water soluble organic solvents includes monoethanolamine, N-methylethanolamine, dimethylsulfoxide and dimethylacetamide. The water soluble organic solvent can be present as a single compound or mixture of compounds. The water soluble organic solvent is present in the composition in amounts of from 30 to 90 weight %, preferably from 40 to 85 weight %, most preferably from 45 to 80 weight % based on the total weight of the composition.

In addition to the water soluble organic solvent, the compositions also contain a sulfonic acid or its corresponding salts. Examples of suitable sulfonic acids include p-toluenesulfonic acid, 1,5-naphthalenedisulfonic acid, 4-ethylbenzenesulfonic acid, dodecylbenzenesulfonic acid, cumensulfonic acid, methylethylbenzenesulfonic acid, isomers of xylenesulfonic acid and the corresponding salts of the sulfonic acids listed above. Examples of salts of sulfonic acids includes ethanolammonium p-toluenesulfonate and triethanolammonium p-toluenesulfonate. The sulfonic acid or its corresponding salts can be present in the compositions as a single acid or salt, or mixture of sulfonic acids or corresponding salts. The sulfonic acid or corresponding salt is present in amounts of from 1 to 20 wt %, preferably from 1.5 to 15 wt %, most preferably 3 to 10 wt % based on the total weight of the composition. Water is a necessary component of the stripping and cleaning compositions of the present invention. Water is present in amounts from 5 to 50 wt %, preferably 5 to 35 wt %, most preferably from 10 to 30 wt % based on the total weight of the composition.

Optionally, the stripping and cleaning compositions contain a corrosion inhibitor. A single corrosion inhibitor compound or mixture of corrosion inhibitors can be used in the stripping and cleaning compositions. Examples of corrosion inhibitors includes benzotriazole, benzoic acid, malonic acid, gallic acid, catechol, ammonium malonate, and the like. The corrosion inhibitor is present in the stripping and cleaning compositions in amounts up to 20 wt %, preferably from 0.1 to 15 wt %, based on the total weight of the stripping and cleaning composition.

Other commonly known components such as dyes, biocides etc. can be included in the stripper and cleaner compositions in amounts up to a total of 5 wt % based on the total weight of the composition.

The stripper and cleaner compositions of the present invention are typically prepared by mixing the components together in a vessel at room temperature until all solids have dissolved. Examples of the aqueous stripper and cleaner compositions of the present invention are set forth in Table I.

Following are nonlimiting examples of the uses of the compositions of the invention.

EXAMPLE 1

A positive photoresist was spin-coated on to a substrate of chemical-vapor-deposited Al—Cu film on silicon wafer. The positive photoresist consisted of diazonaphthoquinone and novolak resin. The photoresist coating was baked at 90° C. for 90 seconds. A pattern was defined on the photoresist by exposure, through a patterned mask, to i-line (365 nm) rays followed by development. The patterned wafer was plasma etched with $Cl_2/BCl_3$ etch gas mixture for 168 seconds at 5 torr of pressure and 20° C. The etched pattern was subjected to oxygen plasma ash for 55 seconds at 0.3 torr pressure and 65° C.

The patterned and ashed wafer was treated by immmersing the wafer in a bath containing formulation 3 from table 1 for 30 minutes at 65° C. Analysis of the cleaned wafer was done by inspection of SEM pictures of the wafers. The SEM photographs showed that the wafer was clean and free of residue and there was no evidence of corrosion.

EXAMPLE 2

A TEOS (tetraethoxysilicate) was coated on a TiN antireflective coating (ARC) layer which in turn was coated on Al—Cu layer which was chemically deposited on a silicon wafer. A positive photoresist layer was spin-coated on the TEOS layer. The photoresist coated was baked at 90° C. for 90 seconds. A pattern was defined on the photoresist by

TABLE I

| Compound/Formulation # | 1 | 2 | 3 | 4 | 5 | 6 | 7 | 8 | 9 | 10 | 11 | 12 | 13 |
|---|---|---|---|---|---|---|---|---|---|---|---|---|---|
| MEA | 70.0 | 71.0 | 70.0 | — | 70.0 | 70.0 | 70.0 | 72.0 | — | — | 71.0 | 73.5 | 72.0 |
| NMEA | — | — | — | 70.0 | — | — | — | — | — | — | — | — | — |
| DMSO | — | — | — | — | — | — | — | — | 71.0 | — | — | — | — |
| DMAc | — | — | — | — | — | — | — | — | — | 71.0 | — | — | — |
| ToSA | 7.0 | 7.0 | 7.0 | — | 7.0 | 7.0 | 7.0 | 7.0 | 7.0 | 7.0 | — | 7.0 | — |
| NDSA | — | — | — | 5.0 | — | — | — | — | — | — | — | — | — |
| EBSA | — | — | — | — | — | — | — | — | — | — | 7.0 | — | — |
| DBSA | — | — | — | — | — | — | — | — | — | — | — | — | 5.0 |
| Deionized Water | 20.5 | 19.5 | 19.5 | 23.0 | 22.0 | 21.5 | 21.0 | 19.0 | 19.5 | 19.5 | 19.5 | 19.5 | 20.5 |
| Gallic Acid | 1.5 | 1.5 | 1.5 | 1.0 | — | 0.5 | 1.0 | 1.0 | 1.5 | 1.5 | 1.5 | — | 1.5 |
| Benzotriazole | 1.0 | 1.0 | 1.0 | 1.0 | 1.0 | 1.0 | 1.0 | 1.0 | 1.0 | 1.0 | 1.0 | — | 1.0 |

MEA = monoethanolamine
NMEA = N-methylethanolamine
DMSO = dimethylsulfoxide
DMAc = dimethylacetamide
ToSA = p-toluene sulfonic acid
NDSA = 1,5-Naphthalenedisulfonic acid
EBSA = 4-ethylbenzene sulfonic acid
DBSA = Dodecylbenzene sulfonic acid The aqueous stripping and cleaning compositions are used to remove post etch and ash, organic and inorganic residues as well as polymeric residues from semiconductor substrates at low temperatures with low corrosion. In general, the stripping and cleaning processes using the compositions of the invention are carried out by immersing a substrate in the stripper/cleaner composition at a temperature of from 25° C. to 85° C. for a period of from 3 minutes to 1 hour. However, the compositions of the present invention can be used in any method known in the art that utilizes a liquid for removal of photoresist, ash or etch residues and/or contaminants.

exposure to i-line rays through a patterned mask followed by development. A two step plasma process was used to transfer the pattern from the resist to the substrate. The first step involved the subjecting the wafer to $CO/CF_4/Ar/CHF_3$ plasma etch gas mixture for the TEOS layer and in-situ followed immediately by $Ar/CF_4/O_2$ for the TiN ARC layer. The etched pattern was ashed with oxygen plasma for 150 seconds at 0.3 torr pressure and 60° C. The etched and ashed wafer was treated by immersing the wafer in a bath containing formulation 3 for 30 minutes at 65° C. Analysis of the cleaned wafer was done by inspecting a SEM picture of the wafer. The SEM showed that the wafer was clean and free of residue and there was no evidence of corrosion.

We claim:

1. A composition for removing etch and/or ash residue or contaminants from a semiconductor substrate comprising:
   (A) from 45 to 90 wt % of a water soluble organic solvent,
   (B) from 3 to 10 wt % of a sulfonic acid or its corresponding salt, and
   (C) from 5 to 50 wt % water wherein all the ingredients contain therein are dissolved.

2. The composition as claimed in claim 1, further comprising a corrosion inhibitor.

3. The composition as claimed in claim 1, wherein the water soluble organic solvent is monoethanolamine, N-methylethanolamine, dimethylsulfoxide, dimethylacetamide or mixtures thereof.

4. The composition as claimed in claim 1, wherein the sulfonic acid or its corresponding salt is wherein the sulfonic acid by the words p-toluene sulfonic acid, 1,5-naphthalene disulfonic acid, 4-ethylbenzene sulfonic acid, dodecylbenzene sulfonic acid or mixtures thereof.

5. The composition as claimed in claim 2, wherein the corrosion inhibitor is gallic acid, catechol, benzotriazole, benzoic acid, malonic acid, ammonium malonate or mixtures thereof.

6. A composition for removing etch and/or ash residue or contaminants from a semiconductor substrate comprising:
   (A) from 45 to 90 wt % of a water soluble organic solvent,
   (B) from 3 to 10 wt % of a sulfonic acid or its corresponding salt,
   (C) from 5 to 50 wt % water, and
   (D) optionally from 0.1 to 15 wt % of a corrosion inhibitor wherein all the ingredients contain therein are dissolved.

7. A composition for removing etch and/or ash residue or contaminants from a semiconductor substrate comprising:
   (A) from 45 to 90 wt % of a water soluble organic solvent,
   (B) from 1 to 20 wt % of a sulfonic acid or its corresponding salt,
   (C) from 5 to 50 wt % water, and
   (D) from 0.1 to 20 wt % of a corrosion inhibitor wherein all the ingredients contain therein are dissolved.

8. The composition of claim 6 wherein component (B) comprises an alkytbenzene sulfonate having less than 9 carbon atoms.

9. The composition of claim 6 wherein amount of component (A) ranges from 50 to 90 wt %.

10. The composition of claim 9 wherein amount of component (A) ranges from 60 to 90 wt %.

11. The composition of claim 7 wherein component (B) comprises a alkylbenzene sulfonate having less than 9 carbon atoms.

12. The composition of claim 7 wherein amount of component (A) ranges from 50 to 90 wt %.

13. The composition of claim 12 wherein amount of component (A) ranges from 60 to 90 wt %.

* * * * *

UNITED STATES PATENT AND TRADEMARK OFFICE
CERTIFICATE OF CORRECTION

PATENT NO. : 6,943,142 B2
DATED : September 13, 2005
INVENTOR(S) : Matthew I. Egbe et al.

It is certified that error appears in the above-identified patent and that said Letters Patent is hereby corrected as shown below:

<u>Column 5,</u>
Line 19, delete the words "or its corresponding salt is wherein the sulfonic acid by the words" and insert the words -- is represented by --.

Signed and Sealed this

Eighth Day of November, 2005

JON W. DUDAS
*Director of the United States Patent and Trademark Office*